United States Patent [19]
Kito et al.

[11] Patent Number: 5,339,325
[45] Date of Patent: Aug. 16, 1994

[54] STRAINED MULTIPLE QUANTUM WELL SEMICONDUCTOR LASER AND A METHOD FOR PRODUCING THE SAME

[75] Inventors: Masahiro Kito, Toyonaka; Yasushi Matsui, Neyagawa, both of Japan

[73] Assignee: Matsushita Electric Industrial Co., Ltd., Osaka, Japan

[21] Appl. No.: 101,933

[22] Filed: Aug. 4, 1993

[30] Foreign Application Priority Data

Aug. 4, 1992 [JP] Japan .................. 4-207743

[51] Int. Cl.$^5$ ............................... H01S 3/19
[52] U.S. Cl. ...................... 372/45; 372/46; 257/18; 437/129
[58] Field of Search ........... 372/45, 46, 48; 257/18, 257/14, 15; 437/129

[56] References Cited

U.S. PATENT DOCUMENTS

| | | | |
|---|---|---|---|
| 4,852,111 | 7/1989 | Hayakawa | 372/48 |
| 4,866,489 | 9/1989 | Yokogawa et al. | 257/18 |
| 5,257,276 | 10/1993 | Forouhar et al. | 372/45 |

FOREIGN PATENT DOCUMENTS

| | | |
|---|---|---|
| 0400559 | 12/1990 | European Pat. Off. |
| 0457571 | 11/1991 | European Pat. Off. |
| 5-29715 | 2/1993 | Japan |

OTHER PUBLICATIONS

Reithmaier et al., "Investigation of Critical Layer Thickness in Elastically Strained InGaAs/GaAlAs Quantum Wells by Photoluminescence and Transmission Electron Microscopy", Appl. Phys. Lett., vol. 54, No. 1, Jan. 2, 1989, pp. 48–50.

"Strain-compensated strained-layer superlattices for 1.5 μm wavelength lasers" by B. I. Miller et al.; Appl. Phys. Lett.; May 6, 1991, pp. 1952–1954.

"High-Performance 1.5 μm Wavelength InGaAs-InGaAsP Strained Quantum Well Lasers & Amplifiers"; by Peter Thijs et al.; IEEE Journal of Quantum Electronics; vol. 27, No. 6; Jun. 1991; pp. 1426–1439.

"Resonance Frequency, Damping, & Differential Gain in 1.5 μm Multiple Quantum-Well Lasers"; M. D. Tatham et al.; IEEE Journal of Quantum Electronics, vol. 28, No. 2, Feb. 1992, pp. 408–414.

Seltzer et al., "Zero-Net-Strain Multiquantum Well Lasers," *Electronics Letters*, vol. 27, No. 14., pp. 1268–1270 (Jul. 4, 1991).

European Search Report for Corresponding Application No. 93112431.7, dated mailed Feb. 25, 1994.

*Primary Examiner*—Georgia Y. Epps
*Attorney, Agent, or Firm*—Ratner & Prestia

[57] ABSTRACT

A strained multiple quantum well semiconductor laser including a semiconductor substrate, a multiple quantum well active layer including a plurality quantum well layers and a plurality of barrier layers, and a multilayer structure including the above multiple quantum well active layer is provided. Each barrier layer is interposed between two of the multiple quantum well active layers. The multilayer structure is formed upon the semiconductor substrate. Herein, at least one of the plurality of barrier layers is thicker than the other barrier layers, thereby serving as a layer absorbing strain which is stored in the barrier layers due to a difference between the lattice constant of semiconductor substrate and the lattice constant each quantum well layer.

16 Claims, 10 Drawing Sheets

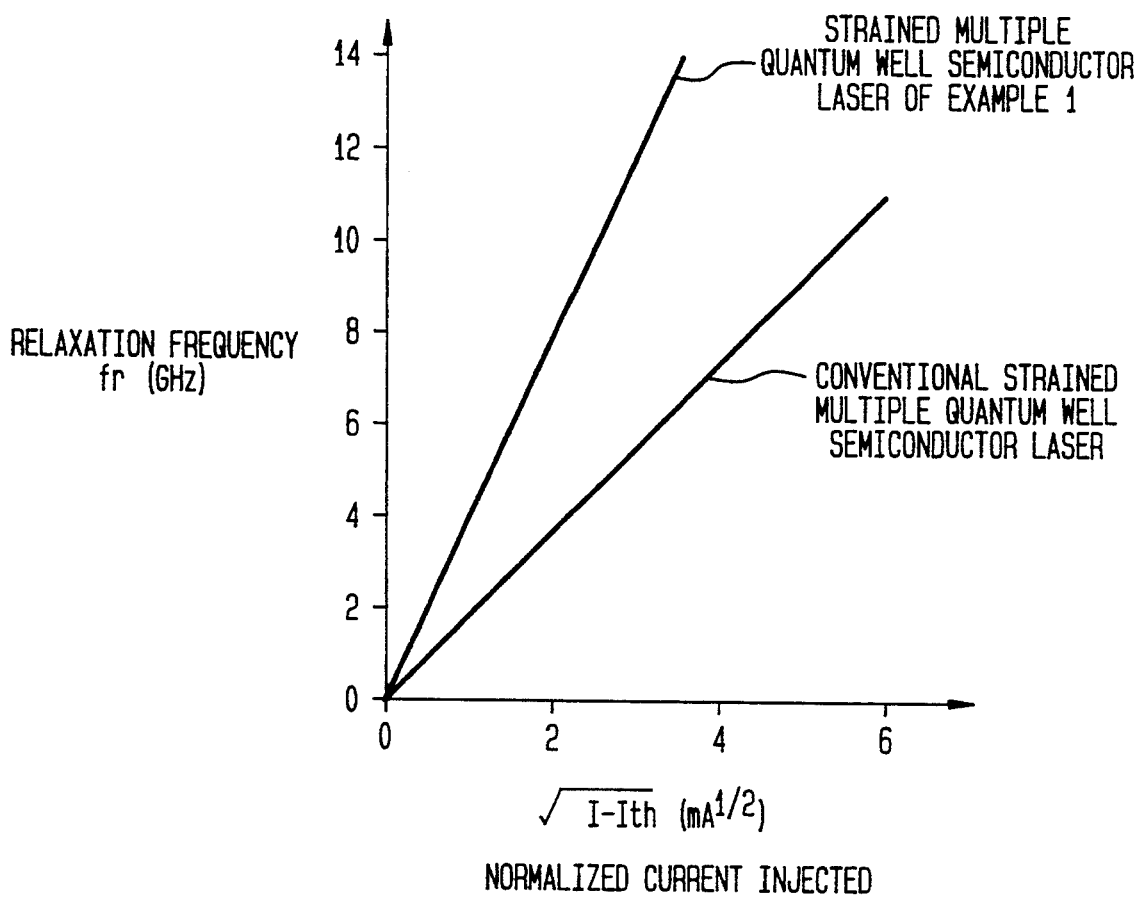

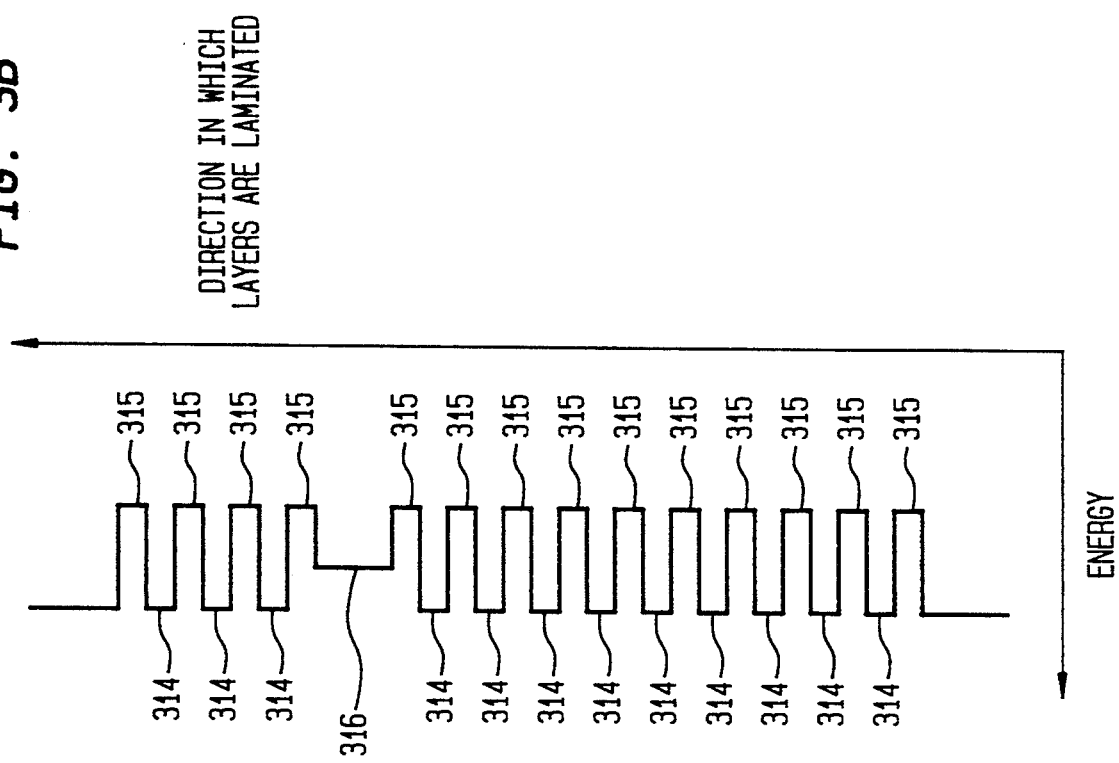
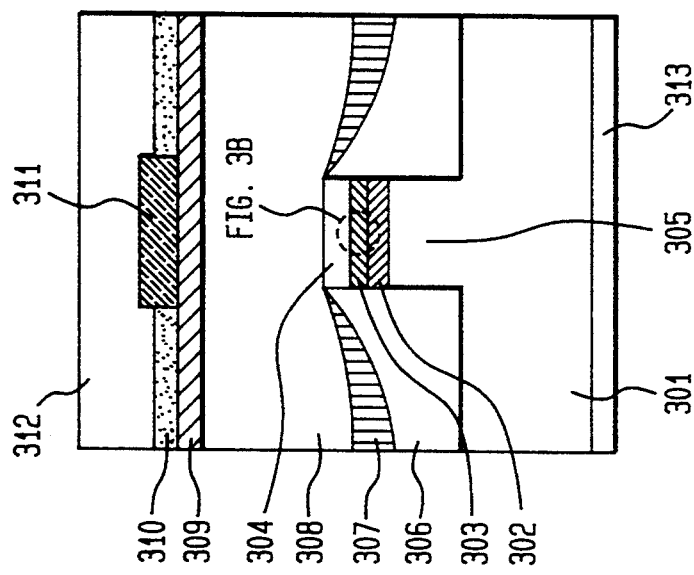

DIRECTION IN WHICH LAYERS ARE LAMINATED

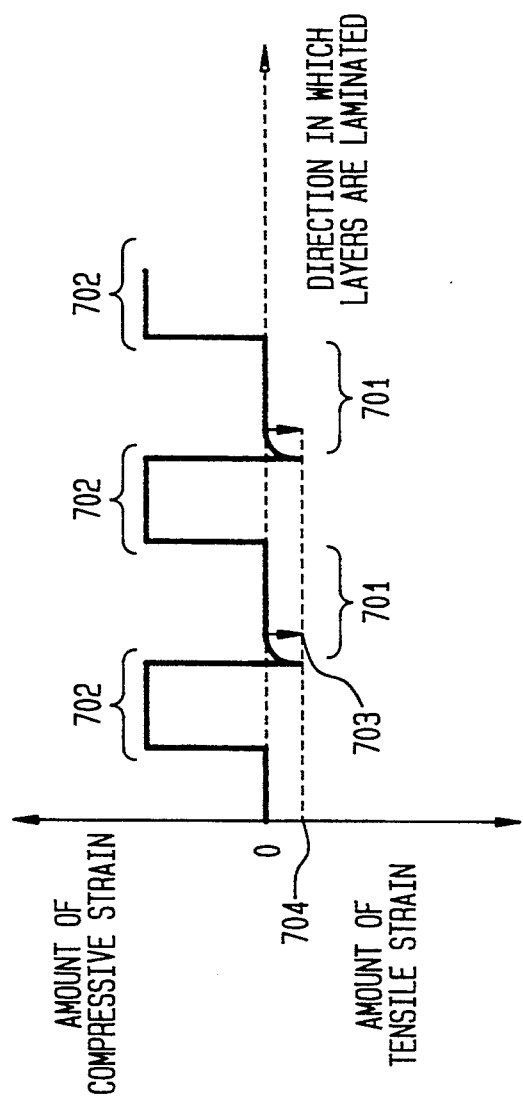

STRAINED MULTIPLE QUANTUM WELL SEMICONDUCTOR LASER AND A METHOD FOR PRODUCING THE SAME

BACKGROUND OF THE INVENTION

1. Field of the Invention

The present invention relates to a strained multiple quantum well semiconductor laser which can be used as a light source for optical communication or optical disks, and to a method for producing the same.

2. Description of the Related Art

In a quantum well structure, it is known that a well layer formed to a critical thickness or less can be made to have compressive strain or tensile strain inside by prescribing the lattice constant of the well layer to be larger (or smaller) than that of a substrate (N.B. a critical thickness: a thickness at which dislocations occur within crystals so as to release lattice mismatching). This technique, which allows one to flexibly design the energy band structure of the quantum well by introducing strain to the inside of the well layer, has been earnestly studied in recent years. In particular, a semiconductor laser in which such a strained quantum well structure is used as an active layer is capable of emitting light in a wavelength band that a lattice-matched type laser cannot emit. Moreover, such a semiconductor laser is expected to show improved performance in emission of light in wavelength bands that a lattice-matched type laser does emit.

Hereinafter, a semiconductor laser having such a strained quantum well structure in a long-wavelength band of 1.55 μm, which is used as a light source for optical communication, will be described.

Light An a wavelength band of 1.55 μm is known to suffer the smallest loss, among light in other wavelength bands, when transmitted through an optical fiber. An exemplary semiconductor laser of this wavelength band of 1.55 μm, whose active layer has a quantum well structure including an InGaAs well layer and an InGaAsP barrier layer, will be described.

In order to introduce compressive strain to the InGaAs well layer, it is necessary to make the mole fraction of Ga smaller than 0.47. Conversely, in order to introduce tensile strain to the InGaAs well layer, it is necessary to make the mole fraction of Ga larger than 0.47. In particular, by introducing compressive strain to the well layer, the state density of heavy holes disposed on top of the valence band is lowered. As a result, the carrier density required for degeneration is lowered. Therefore, Bernard-Duraffourg's requirements for laser oscillation can be satisfied at a low carrier density. Therefore, recombination of spontaneous emission is restrained, thereby lowering the threshold current. It is pointed out that, while a semiconductor laser in a long-wavelength band, especially that of 1.55 pm, has a large Auger recombination component in its threshold current, introduction of compressive strain to the well layers thereof lowers its threshold carrier density, thus drastically reducing the Auger recombination current. Due to the lowered carrier density, the half-hand width of the gain spectra is reduced, Thereby increasing the differential gain of the semiconductor laser.

Such a semiconductor laser, whose active layer has a quantum well structure in which compressive strain is introduced to the well layers, has already been realized, and is reported to have a lower threshold current density, an improved characteristic temperature, and a higher differential gain. FIG. 5 illustrates the structure of a conventional example of such a semiconductor laser. The semiconductor laser includes an n-InP substrate 501, an InGaAsP waveguide layer (A) 502 having an appropriate composition for obtaining light in a wavelength band of 1.3 μm, an active layer 503 having a strained multiple quantum well structure, $In_{0.7}Ga_{0.3}As$ well layers 504, InCaAsP barrier layers 505 having an appropriate composition for obtaining light in a wavelength band of 1.3 μm, an InGaAsP waveguide layer (B) 506 having an appropriate composition for obtaining light in a wavelength band of 1.3 μm, and a p-InP cladding layer 507. Compressive strain of about 1.2% is introduced to the $In_{0.7}Ga_{0.3}As$ well layers 504. Four $In_{0.7}Ga_{0.3}As$ well layers 504 are provided. The thickness of each $In_{0.7}Ga_{0.3}As$ well layer 504 is 4 nm. The thickness of each InGaAsP barrier layer 505 is 10 nm.

In optical communication, transmission of a large amount of information requires a semiconductor laser capable of operating at a very high speed. However, the upper limit of the response speed of a semiconductor laser is dependent on the relaxation frequency (fr) inherent to the semiconductor laser. The relaxation frequency (fr) is derived from the following Equation (1):

$$fr = \frac{1}{2\pi} \cdot \left( \frac{A \cdot \Gamma}{q \cdot V_a} \right)^{\frac{1}{2}} \cdot (I - I_{th})^{\frac{1}{2}} \tag{1}$$

where A, r, $V_a$, q, I, and $I_{th}$ respectively represent the differential gain, the light-confinement coefficient with respect to all the well layers, the total volume of the well layers, electron charge, the amount of the injected current, the amount of the threshold current. If strain is introduced to the well layers, the differential gain can be made about twice as large as that of a semiconductor laser having a non-strained quantum well structure. In a case where strain is introduced to well layers made of InGaAs, however, varying the composition thereof, as is necessitated for generating the strain, inevitably causes the energy band gap as well as the lattice constant to vary. For example, in a case where compressive strain is to be introduced, the lattice constant of InGaAs in a bulk state should be made larger than that of InP, of which the substrate is to be made. Accordingly, the In content of each InGaAs well layer should be increased. In this case, the energy band gap of the InGaAs well layer shifts toward the low-energy side. As a result, the oscillation wavelength becomes larger than 1.55 μm, provided that the thickness of each InGaAs well layer is made the same as that of an InGaAs well layer of a semiconductor laser having a non-strained quantum well structure (i.e. 6 nm), but such a semiconductor laser is not practical in optical communication. In order that the oscillation wavelength be 1.55 μm, each InGaAs well layer should be made as thin as 2 to 4 nm, thereby obtaining an quantum size effect so that the oscillation wavelength shifts to the long-wavelength side. However, employing a thinner well layer inevitably lowers the light-confinement coefficient, therefore lowering the value $\Gamma/V_a$. FIG. 6 illustrates the dependence of the value $\Gamma/V_a$ on the number of well layers, with respect to a case where the thickness of each well layer is 6 nm and a case where the thickness of each well layer is 3 nm. As is seen from FIG. 6, when seven well layers are provided, reducing the thickness of each well layer from 6 nm to 3 nm lowers the value $\Gamma/V_a$ by 20%. As has been described, it is necessary to provide a sufficiently large number of well layers so that the increase of differential gain due to the introduction of strain to the well layers will effectively raise the relaxation frequency.

In a multiple quantum well structure, introducing strain to the well layers thereof also introduces strain to the barrier layers thereof, according to the principle of action and reaction. FIGS. 7A and 7B each illustrate how the amount of strain varies along the direction that the layers are laminated. FIG. 7A describes a case where the strained well layers are made of InGaAs and the barrier layers are made of InP, while FIG. 7B describes a case where the strained well layers are made of InGaAs and the barrier layers are made of InGaAsP. As is seen from FIG. 7A, deformation of lattice occurs due to the tensile stress 703 introduced by well layers 702, to which compressive strain is introduced. However, it takes only several atomic layers for the lattice constant to be brought back to that of a non-strained state, since the barrier layers 701 consist of a binary material of InP. Therefore, tensile strain 704 due to lattice deformation exists in only the interface between each barrier layer 701 and each well layer 702. In other words, each barrier layer VOL is fairly well brought back to a non-strained state before the next well layer 702 is formed, on conditions that each barrier layer 701 has a thickness of only a few nanometers. Thus, it becomes possible to grow as many strained well layers 702 as desired.

As is seen from FIG. 7B, on the other hand, deformation of lattice occurs due to the tensile stress 703 introduced by well layers 702, to which compressive strain is introduced. In this case, however, since barrier layers 705 are made of a quaternary material, InGaAsP, the arrangement of atoms changes, and therefore the barrier layers 705 tend to grow with the tensile strain stored inside. A thickness 706 of each barrier layer 705, which is about 10 nm, is not sufficiently large to bring back the lattice constant to a non-strained state.

In fabrication of such a semiconductor laser, the tensile strain accumulates within the barrier layers 705 as the well layers 702 and the barrier layers 705 keep being alternatively grown upon one another, until the tensile strain reaches a critical level 708. Past the critical level 708, dislocations due to lattice relaxation occur within the barrier layers 705. These dislocations eventually spread among the whole quantum well structure, making it impossible to obtain a quality quantum well structure. For example, in a case where compressive strain of about 1% is introduced to each InGaAs well layer 702 having a thickness of 10 nm, the light emitting performance of the semiconductor laser drastically drops when 10 InGaAs well layers 702 have been grown. This is presumably because the tensile strain stored within the barrier layers 705 reaches the critical level when 10 InGaAs well layers 702 have been grown. On the other hand, compressive strain of at least 1% must definitely be introduced to the well layers 702 so as to attain a substantial improvement in the light emitting performance. Therefore, in a conventional strained multiple quantum well semiconductor laser, only 10 or less well layers can be formed when compressive strain of 1% is introduced to the well layers. Accordingly, such a strained multiple quantum well semiconductor laser is expected to show little enhancement in the relaxation frequency thereof, as compared with a non-strained multiple quantum well semiconductor laser having more than 10 well layers formed.

SUMMARY OF THE INVENTION

According to a first aspect of the present invention, there is provided a strained multiple quantum well semiconductor laser comprising: a semiconductor substrate; a multiple quantum well active layer including a plurality of quantum well layers and a plurality of barrier layers, each of the plurality of quantum well layers having a lattice constant different from a lattice constant of the semiconductor substrate, and each of the plurality of barrier layers being interposed between two of the quantum well layers; and a multilayer structure including the multiple quantum well active layer, the multilayer structure being formed upon the semiconductor substrate, wherein at least one of the plurality of barrier layers is thicker than the other barrier layers, thereby serving as a layer for absorbing strain which is stored in the barrier layers due to a difference between the lattice constant of the semiconductor substrate and the lattice constant of each quantum well layer.

In one embodiment of the invention, the at least one of the barrier layers has such a thickness that a maximum value of the strain within each barrier layer is smaller then a critical level.

In another embodiment of the invention, the at least one of the barrier layers has a thickness twice as large as the thickness of each of the other barrier layers.

In still another embodiment of the invention, the at least one of the barrier layers has a portion where substantially no strain is stored.

In still another embodiment of the invention, the at least one of the barrier layers has such a thickness that light emitted by the multiple quantum well active layer is not split into a plurality of portions.

In still another embodiment of the invention, the at least one of the barrier layers which are thicker than the other barrier layers has an energy band gap substantially as large as an energy band gap of each of the other barrier layers.

In still another embodiment of the invention, the at least one of the barrier layers which are thicker than the other barrier layers has an energy band gap smaller than an energy band gap of each of the other barrier layers.

In still another embodiment of the invention, the semiconductor substrate includes a stripe-shaped ridge on a principal plane thereof, and the multilayer structure is formed on the stripe-shaped ridge.

In still another embodiment of the invention, the multilayer structure includes a pair of cladding layers, the strained multiple quantum well active layer being interposed therebetween.

According to a second aspect of the present invention, there is a method for producing a strained multiple quantum well semiconductor laser comprising: a semiconductor substrate; a multiple quantum well active layer including a plurality of quantum well layers and a plurality of barrier layers, each of the plurality of quantum well layers having a lattice constant different from a lattice constant of the semiconductor substrate, and each of the plurality of barrier layers being interposed between two of the quantum well layers; and a multilayer structure including the multiple quantum well active layer, the multilayer structure being formed upon the semiconductor substrate, when the plurality of quantum well layers and the plurality of barrier layers are alternatively formed so as to be laminated upon one another, at least one of the plurality of barrier layers is formed so as to be thicker than the other barrier layers.

In one embodiment of the invention, the at least one of the barrier layers is formed with such a thickness that a maximum value of the strain within each barrier layer is smaller than a critical level.

In another embodiment of the invention, the at least one of the barrier layers is formed with a thickness twice as large as =he thickness of each of the other barrier layers.

In still another embodiment of the invention, the at least one of the barrier layers is formed with a portion where substantially no strain is stored.

In still another embodiment of the invention, the at least one of the barrier layers is formed with such a thickness that light emitted by the multiple quantum well active layer is not split into a plurality of portions.

In still another embodiment of the invention, the at least one of the barrier layers which are thicker than the other barrier layers is made of a material having an energy hand gap substantially as large as an energy band gap of a material of which each of the other barrier layers is made.

In still another embodiment of the invention, the at least one of the barrier layers which are thicker than the other barrier layers is made of a material having an energy band smaller than an energy band gap of a material of which each of the other barrier layers is made.

Thus, the invention described herein makes possible an advantage of providing a semiconductor laser having a strained multiple quantum well structure including 10 or more strained well layers without letting dislocations occur within the active layer. Moreover, a semiconductor laser according to the present invention has a relaxation frequency 1.5 times as high as that of a conventional semiconductor laser at a given normalization current injected, because the hole injection efficiency thereof does not deteriorate. As a result, a semiconductor laser having a high operation speed can easily be obtained.

This and other advantages of the present invention will become apparent to those skilled in the art upon reading and understanding the following detailed description with reference to the accompanying figures.

BRIEF DESCRIPTION OF THE DRAWINGS

FIG. 2 is a graph illustrating the dependence of the relaxation frequency on the normalization current injected, with respect to the strained multiple quantum well semiconductor laser of the first example of the present invention and a conventional strained multiple quantum well semiconductor laser.

FIG. 3A is a front view showing a configuration of a strained multiple quantum well semiconductor laser according to a second example of the present invention. FIG. 3B is an energy band diagram of a strained multiple quantum well active layer of the semiconductor laser of FIG. 3A.

FIGS. 7A and 7B are graphs illustrating how the amount of strain varies along a direction in which layers are laminated, with respect to an exemplary strained multiple quantum well semiconductor laser. FIG. 7A describes a case where strained well layers are made of InGaAs and barrier layers are made of InP, while FIG. 7B describes a case where strained well layers are made of InGaAs and barrier layers are made of InGaAsP.

FIG. 10A describes a case where barrier layers are made of InGaAsP having an appropriate composition for obtaining light in a wavelength band of 1.3 pm, while FIG. 10B describes a case where barrier layers are made of InGaAsP having an appropriate composition for obtaining light in a wavelength band of 1.1 μm.

DESCRIPTION OF THE PREFERRED EMBODIMENTS

Figure 8:
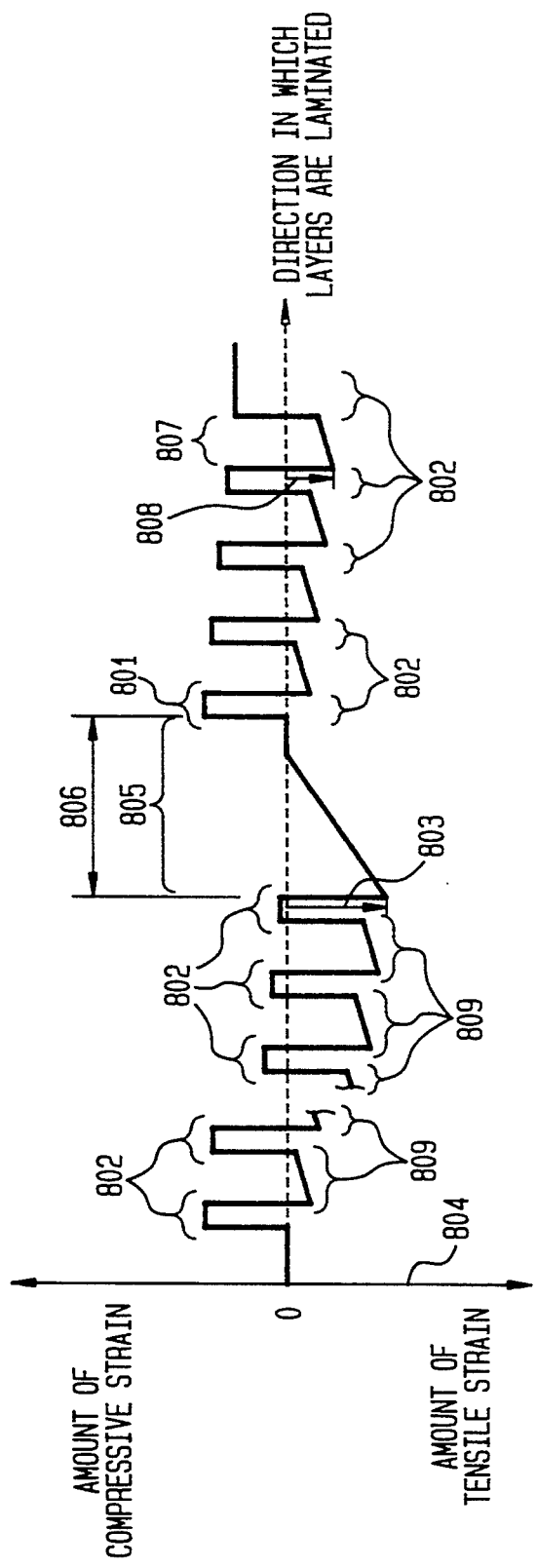
FIG. 8 is a graph illustrating how the amount of strain varies along a direction in which layers are laminated, with respect to an exemplary strained multiple quantum well semiconductor laser in which 14 $In_{0.7}Ga_{0.3}As$ strained well layers are provided and InGaAsP barrier layers have a thickness of 10 nm, except a 10th InGaAsP barrier layer serving as a strain absorbing layer which base thickness of 50 nm.

FIG. 8 illustrates how the amount of strain varies along the direction in which the layers are laminated. Herein, $In_{0.7}Ga_{0.3}As$ strained well layers 801, 802 and InGaAsP barrier layers 805, 807, 809 are grown. The 10th InGaAsP barrier layer 805 provided as a strain absorbing layer, which is grown after 10 $In_{0.7}Ga_{0.3}As$ strained well layers 802 have been grown, has a thickness 806 of 50 nm, and the other InGaAsP barrier layers 807, 809 each have a thickness of 10 nm. Cumulative tensile strain 803 stored within the 10th InGaAsP barrier layer 805 is caused by the first 10 $In_{0.7}Ga_{0.3}As$ strained well layers 802. As is seen from FIG. 8, the cumulative tensile strain 803 has not reached a critical level 804. Moreover, the cumulative tensile strain 803 is eliminated by being absorbed by the 10th InGaAsP barrier layer 805 having the thickness 806 of 50 nm, by the time the 11th In0.7Ga0.3As strained well layer 801 is grown. In this way, cumulative tensile strain 808 stored within the 14th InGaAsP barrier layer 807 manages to remain below the critical level 804. Furthermore, only one InGaAsP barrier layer 805 is grown with a thickness of 50 run. Therefore, the hole injection efficiency suffers substantially negligible influence due to the InGaAsP barrier layer 805.

Figure 9A:
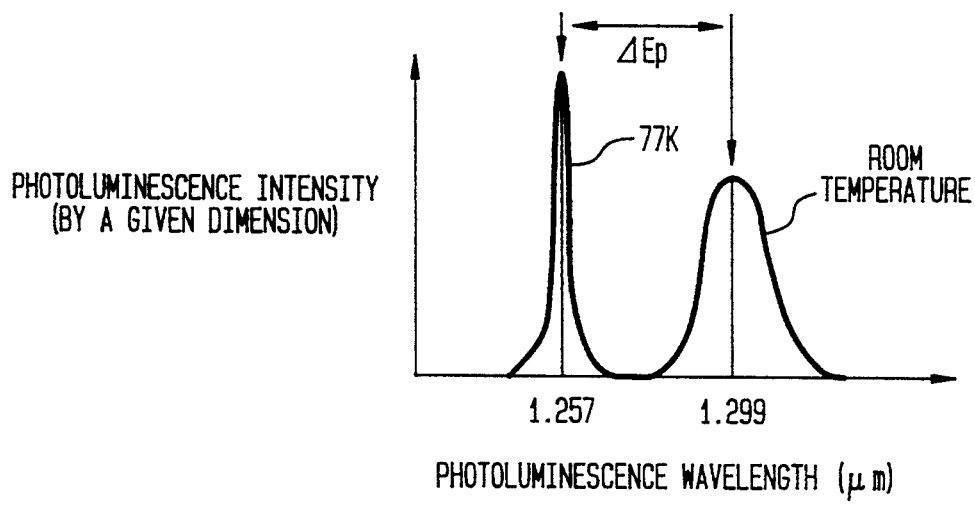
FIG. 9A is a graph illustrating photoluminescence spectra of an exemplary strained multiple quantum well semiconductor laser, measured at room temperature and the liquefaction temperature of nitrogen (77 K).
Figure 9B:
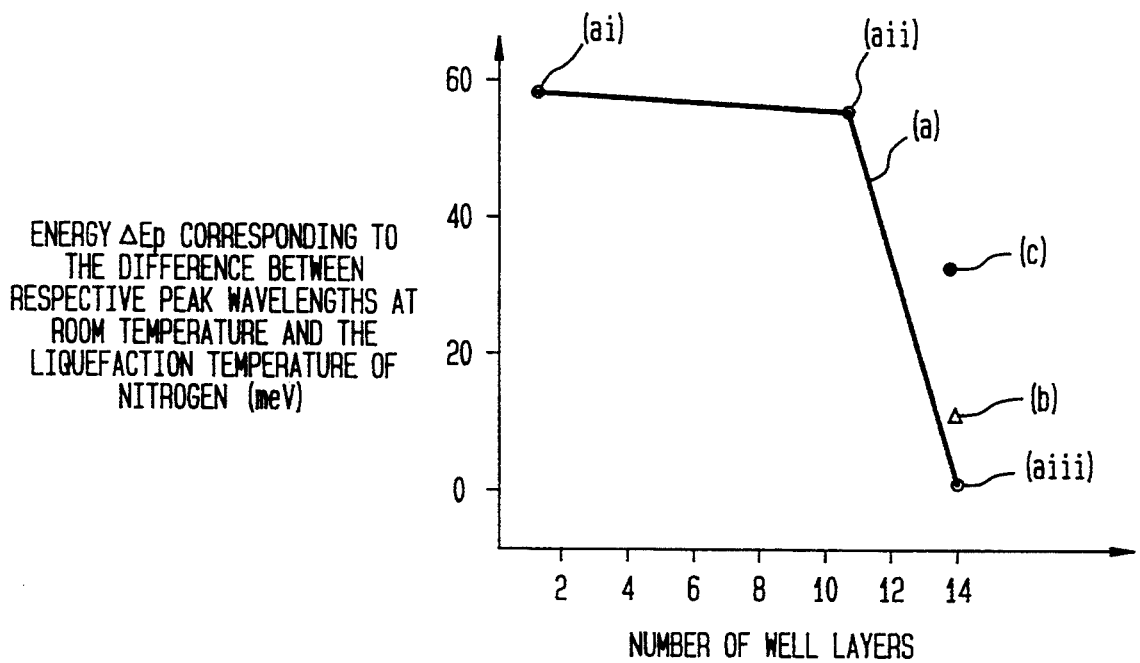
FIG. 9B is a graph illustrating the dependence of an energy difference $\Delta E_p$ corresponding t o the difference between respective peak wavelengths at room temperature and the liquefaction temperature of nitrogen on the number of well layers, with respect to exemplary strained multiple quantum well semiconductor lasers.

The effect of incorporation of strain absorbing layers will be illustrated by photoluminescence evaluation, with reference to FIGS. 9A and 9B. (Hereinafter, barrier layers serving also as strain absorbing layers are referred to as "strain absorbing layers" as opposed to the other barrier layers, which are referred to as "barrier layers".) Each well layer in all the sample strained multiple quantum well structures used in the evaluation is made of InGaAsP having an appropriate composition for obtaining light in a wavelength band of 1.5 μm and has compressive strain of and a thickness of 3 nm. Also, each barrier layer used in all the sample strained multiple quantum well structures used in the evaluation is made of InGaAsP having an appropriate composition for obtaining light in a wavelength band of 1.05 μm and has a thickness of 10 nm. Samples of the following three kinds were used: $(a_i)$, $(a_{ii})$, and $(a_{111})$: conventional strained multiple quantum well structures including no strain absorbing layers (numbers of well layers: 1, 10, and 14, respectively); (b): a strained multiple quantum well structure in which a strain absorbing layer having a thickness of 15 nm is grown next to the 10th well layer (number of well layers: 14); and (c): a strained multiple quantum well structure in which a strain absorbing layer having a thickness of 50 nm is grown next to the 10th well layer (number of well layers: 14). All the above samples emit light in a wavelength band of 1.3 μm, which is a wavelength band used in optical communication as well as that of 1.55 μm. FIG. 9A illustrates photoluminescence spectra with respect to sample (a) (including one well layer) measured at room temperature and the liquefaction temperature of nitrogen (77 K). As is seen from FIG. 9A, peak wavelengths of 1.257 μm and 1.299 Nm are observed at, respectively, the liquefaction temperature of nitrogen and room temperature. The shift from 1.299 μm to 1.257 μm occurs because the energy band gap of the well layer increases as the temperature decreases. FIG. 9B illustrates an energy difference $\Delta E_p$ corresponding to the difference between respective peak wavelengths at room temperature and the liquefaction temperature of nitrogen, with respect to samples $(a_i)$, $(a_{ii})$, $(a_{iii})$, (b), and (c). The energy difference $\Delta E_p$ of sample $(a_i)$ (including one well layer) and that of sample $(a_{ii})$ (including 10 well layers) are approximately the same. However, the energy difference $\Delta E_p$ of sample $(a_{ii})$ (including 14 well layers) is substantially zero. That is, in the photoluminescence spectra of sample $(a_{iii})$, the peak wavelength at room temperature and that at the liquefaction temperature of nitrogen are substantially the same, indicating that crystal defects have emerged. In other words, a conventional strained multiple quantum well structure having no strain absorbing layer can include only up to about 10 strained well layers. The energy difference $\Delta E_p$ of sample (b) (including 14 well layers) is also substantially zero, indicating that a strain absorbing layer having a thickness of 15 nm cannot effectively eliminate the crystal defects. The energy difference $\Delta E_p$ of sample (c), however, indicates that the peak wavelength shifts according as the temperature changes from room temperature to the liquefaction temperature of nitrogen. It can be seen that the strain absorbing layer having a thickness of 50 nm effectively ensures good crystallinity although as many as 14 well layers are provided.

Figure 10A:
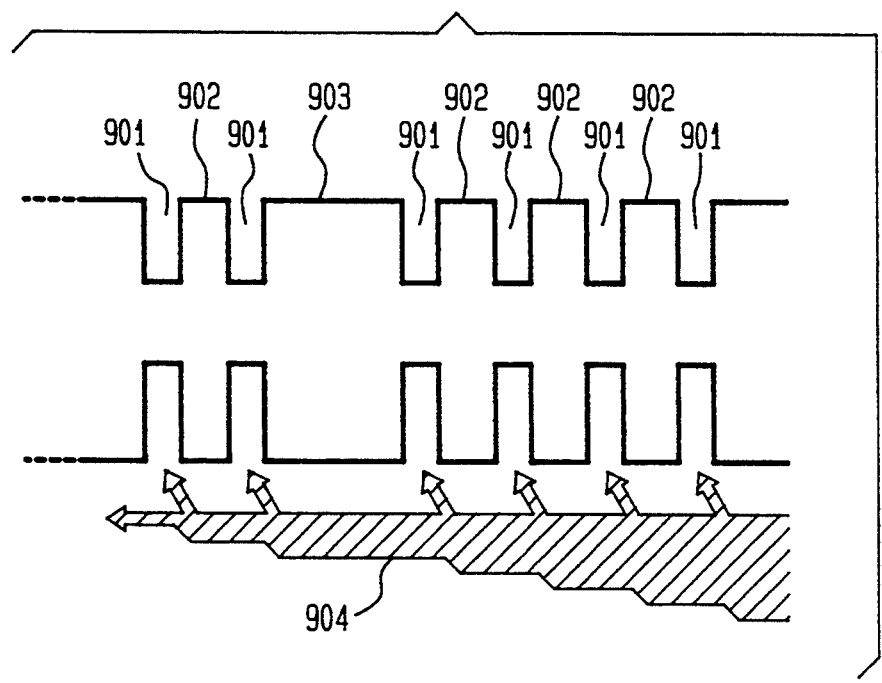
FIGS. 10A and 10B are diagrams showing the hole injection efficiency of an exemplary strained multiple quantum well semiconductor laser.
Figure 10B:
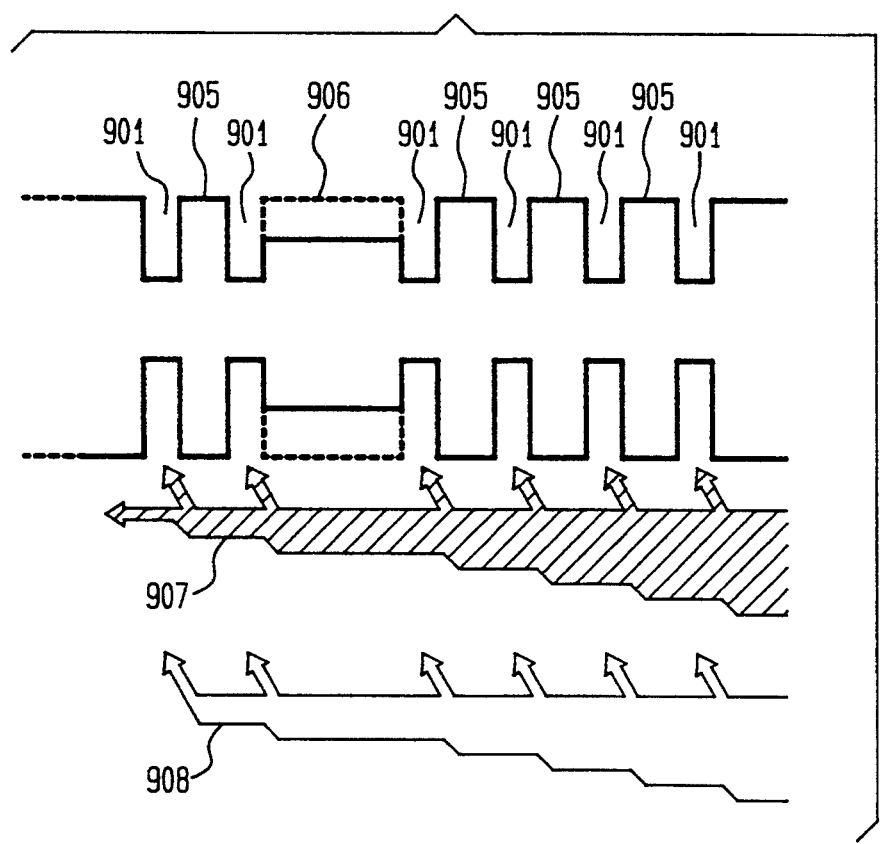

InGaAsP having such a composition that the energy band gap thereof Is large can alternatively be used for the barrier layers so as to prevent electrons from overflowing the well layers. In this case, however, employing a barrier layer having a large thickness results in a considerable influence on the hole injection efficiency. FIGS. 10A and 10B, which are energy band diagrams, illustrate the hole injection efficiency. FIG. 10A describes a case where barrier layers 902 are made of InGaAsP having an appropriate composition for obtaining light in a wavelength band of 1.3 μm, while FIG. 10B describes a case where barrier layers 905 are made of InGaAsP having an appropriate composition for obtaining light in a wavelength band of 1.1 μm. Strained well layers 901 in both cases are made of InGaAs.

In FIG. 10A, each barrier layer 902, because of its composition for obtaining light in a wavelength band of 1.3 μm, has a relatively small energy difference $\Delta E_v$ with each well layer 901 in the valence band. In this case, a strain absorbing layer 903 can also be made of InGaAsP having an appropriate composition for obtaining light in a wavelength band of 1.3 μm. Therefore, the strain absorbing layer 903, although having a thickness larger than that of each barrier layer 902, is expected to have only a small influence on the hole injection efficiency. Hatched arrows 904 in FIG. 10A show a flow of holes. It can be seen that t he holes uniformly flow into the well layers 901, a sufficient amount of holes flowing beyond the strain absorbing layer 903.

In FIG. 10B, on the other hand, each barrier layer 905 is made of InGaAsP having an appropriate composition for obtaining light in a wavelength band of 1.1 μm. Therefore, an energy difference $\Delta E_v$ of each barrier layer 905 with etch well layer 901 in the valence band is larger by 121 meV than that of InGaAsP having in appropriate composition for obtaining light in a wavelength band of 1.3 μm. If a strain absorbing layer 906 is also made of InGaAsP having an appropriate composition for obtaining light in a wavelength band of 1.1 μm, the energy band (at the strain absorbing layer 906) is to be described by the broken line, and the holes flow as illustrated by blank arrows 908, indicating fewer holes flow beyond the strain absorbing layer 906 (which has a larger thickness than that of each barrier layer 905) than in the case of FIG. 10A. Such deterioration of hole in, action efficiency reduces the differential gain, and therefore lowers the upper limit of the response speed of the semiconductor laser, as has been described earlier. However, this deterioration of hole injection efficiency can be prevented if the strain absorbing layer 906 has an energy band gap smaller Than that of each barrier layer 905. For example, if the strain absorbing layer 906 alone is made of InGaAsP having an appropriate composition for obtaining light in a wavelength band of 1.3 μm, since InGaAsP having such a composition has a energy band gap smaller than that of InGaAsP having an appropriate composition for obtaining light in a wavelength band of 1.1 μm, the energy band (at the strain absorbing layer 906) is to be described by the solid line, and the holes flow as illustrated by hat chad arrows 907, indicating that more holes flow beyond the strain absorbing layer 906 than indicated by the blank arrows 908. The hole injection efficiency can thus be improved.

Hereinafter, the present invention will be described by way of examples, with reference to the accompanying drawings.

EXAMPLE 1

Figure 1B:
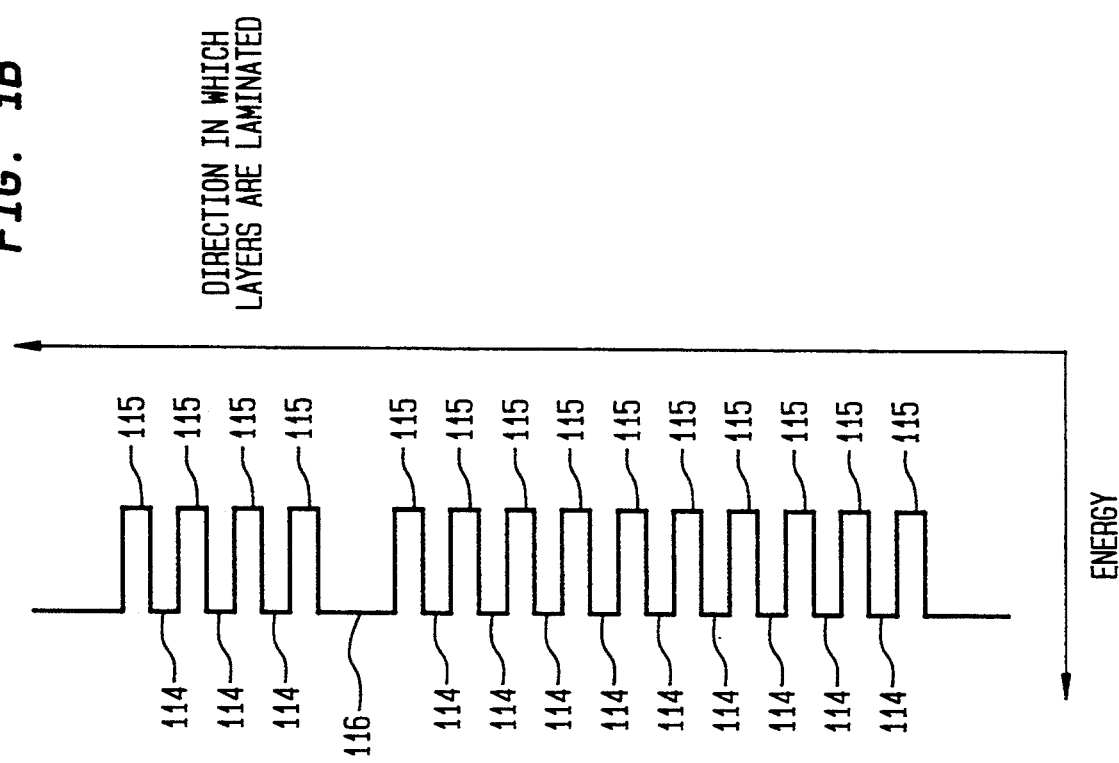
FIG. 1B is an energy band diagram of a strained multiple quantum well active layer of the semiconductor laser of FIG. 1A.
Figure 1A:
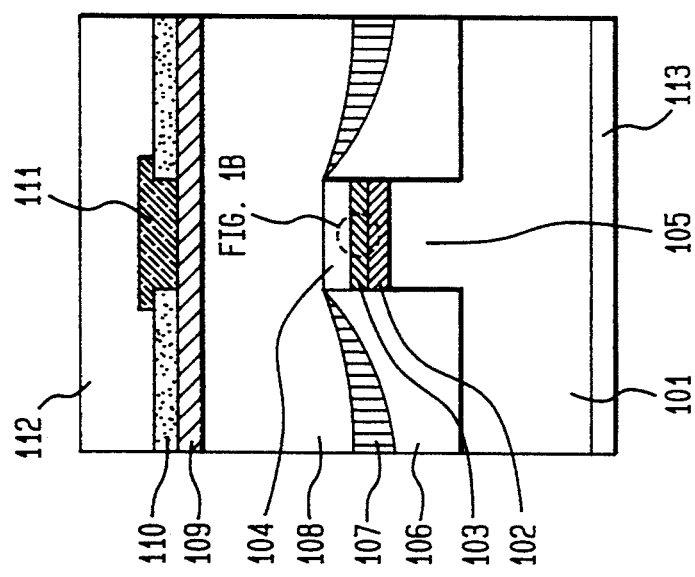
FIG. 1A is a front view showing a configuration of a strained multiple quantum well semiconductor laser according to a first example of the present invention.

FIG. 1A is a front view showing the structure of a strained multiple quantum well semiconductor laser according to the present invention. FIG. 1B is an energy band diagram of a strained multiple quantum well active layer 103 of the semiconductor laser. The semiconductor laser includes an n-InP substrate 101 having a mesa ridge 105 formed in an upper portion thereof and a multilayer structure formed on the mesa ridge 105. The multilayer structure includes an n-$In_{0.76}Ga_{0.24}As_{0.55}P_{0.45}$ waveguide layer 102 by which light in a wavelength band of 1.3 $\mu$m can be obtained, the strained multiple quantum well active layer 103, and a p-InP cladding layer 104, which are grown in this order. The multiple quantum well active layer 103 includes 14 undoped $In_{0.7}Ga_{0.3}As$ strained well layers 115 (thickness: 3 nm), undoped $In_{0.75}Ga_{0.24}As_{0.55}P_{0.45}$ barrier layers 114 (thickness: 10 nm) by which light in a wavelength band of 1.3 $\mu$m can be obtained, and an undoped $In_{0.76}Ga_{0.24}As_{0.55}P_{0.45}$ strain absorbing layer 116 (thickness: 50 nm) by which light in a wavelength band of 1.3 $\mu$m can be obtained. On both sides of the mesa ridge 105, a p-InP current blocking layer 106 and an n-InP current blocking layer 107 are grown so as to reduce leakage currents flowing into layers besides the strained multiple quantum well active layer 103. Furthermore, upon the mesa ridge 105, a buried p-InP layer 108 and a p-InGaAsP contact layer 109 are grown in this order, upon which an $SiO_2$ film 110, an Au/Zn electrode 111 on the p-side of the semiconductor laser, and a Ti/Au electrode 112 on the p-side of the semiconductor laser are deposited. Upon the bottom side of the n-InP substrate 101, an Au/Sn electrode 113 on the n-side of the semiconductor laser is deposited.

In the semiconductor laser shown in FIG. 1A, the undoped InCaAsP strain absorbing layer 116, which is a main feature of the present example, absorbs strain stored within the undoped $In_{0.76}Ga_{0.24}As_{0.55}P_{0.45}$ barrier layers 114. Therefore, as many as 14 undoped $In_{0.7}Ga_{0.3}As$ strained well layers 115 can be grown without making the thickness of each undoped $In_{0.76}Ga_{0.24}As_{0.55}P_{0.45}$ barrier layer 114 large. FIG. 2 illustrates the dependence of the relaxation frequency on the normalization current injected, with respect to the semiconductor laser of the present example and a conventional strained multiple quantum well semiconductor laser. The conventional strained multiple quantum well semiconductor laser includes barrier layers having a thickness of 10 nm and four well layers, and the same amount of strain as that introduced to the above mentioned strained well layers 115 is introduced to the four well layers. As is seen from FIG. 2, the semiconductor laser of the present example has a relaxation frequency which is 1.5 times as high as that of the conventional strained multiple quantum well semiconductor laser at any amount of normalization current injected.

EXAMPLE 2

FIG. 3A is a front view showing the structure of another strained multiple quantum well semiconductor laser according to the present invention. FIG. 3B is an energy band diagram of a strained multiple quantum well active layer 303 of the semiconductor laser. The semiconductor laser includes an n-InP substrate 301 having a mesa ridge 305 formed in an upper portion thereof and a multilayer structure formed on the mesa ridge 305. The multilayer structure includes an n-$In_{0.86}Ga_{0.14}As_{0.31}P_{0.69}$ waveguide layer 302 by which light in a wavelength band of 1.1 $\mu$m can be obtained, the strained multiple quantum well active layer 303, and a p-InP cladding layer 304, which are grown in this order. The strained multiple quantum well active layer 303 includes 14 undoped $In_{0.7}Ga_{0.3}As$ strained well layers 315 (thickness: 3 nm), undoped $In_{0.86}Ga_{0.14}As_{0.31}P_{0.69}$ barrier layers 314 (thickness: 10 nm) by which light in a wavelength band of 1.1 pm can be obtained, and an undoped $In0.76Ga_{0.24}As_{0.55}P_{0.45}$ strain absorbing layer 316 (thickness: 50 nm) by which light in a wavelength band of 1.3 Nm can be obtained. The undoped $In_{0.76}Ga_{0.24}As_{0.55}P_{0.45}$ strain absorbing layer 316 has an energy band gap smaller than that of each undoped $In_{0.86}Ga_{0.14}As_{0.31}P_{0.69}$ barrier layer 314. On both sides of the mesa ridge 305, a p-Inp current blocking layer 306 and an n-InP current blocking layer 307 are grown so as to reduce leakage currents flowing into layers besides the strained multiple quantum well active layer 303. Furthermore, upon the mesa ridge 305, a buried p-InP layer 308 and a p-InGaAsP contact layer 309 are grown in this order, upon which an $SiO_2$ film 310, an Au/Zn electrode 311 on the p-side of the semiconductor laser, and a Ti/Au electrode 312 on the p-side of the semiconductor laser are deposited. Upon the bottom side of the n-InP substrate 301, an Au/Sn electrode 313 on the n-side of the semiconductor laser is deposited.

Figure 4:
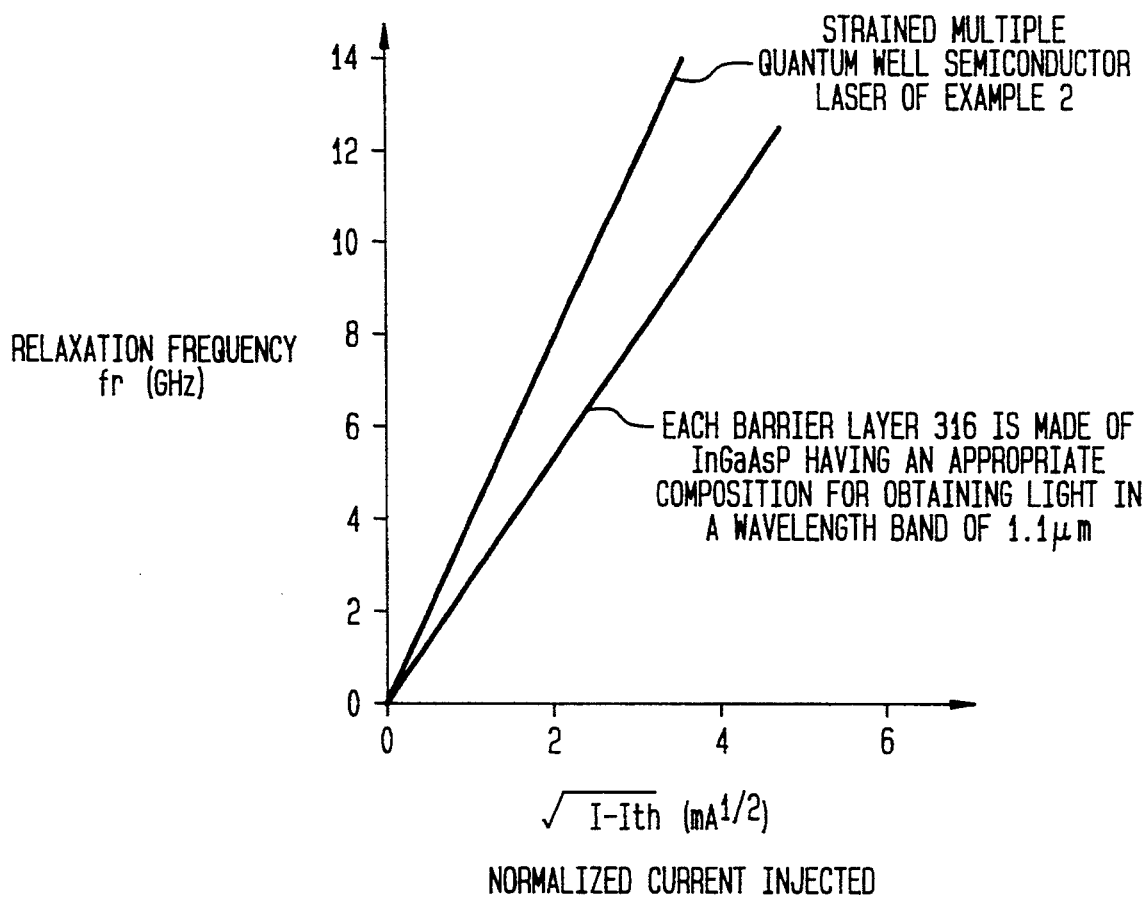
FIG. 4 is a graph illustrating the dependence of the relaxation frequency on the normalization current injected, with respect to the strained multiple quantum well semiconductor laser of the second example of the present invention and an exemplary strained multiple quantum well semiconductor laser having the same structure as that of the semiconductor laser of the second example except that a strain absorbing layer thereof is made of undoped $In_{0.86}Ga_{0.14}As_{0.31}P_{0.69}$ by which light in a wavelength band of 1.1 μm can be obtained.
Figure 5:
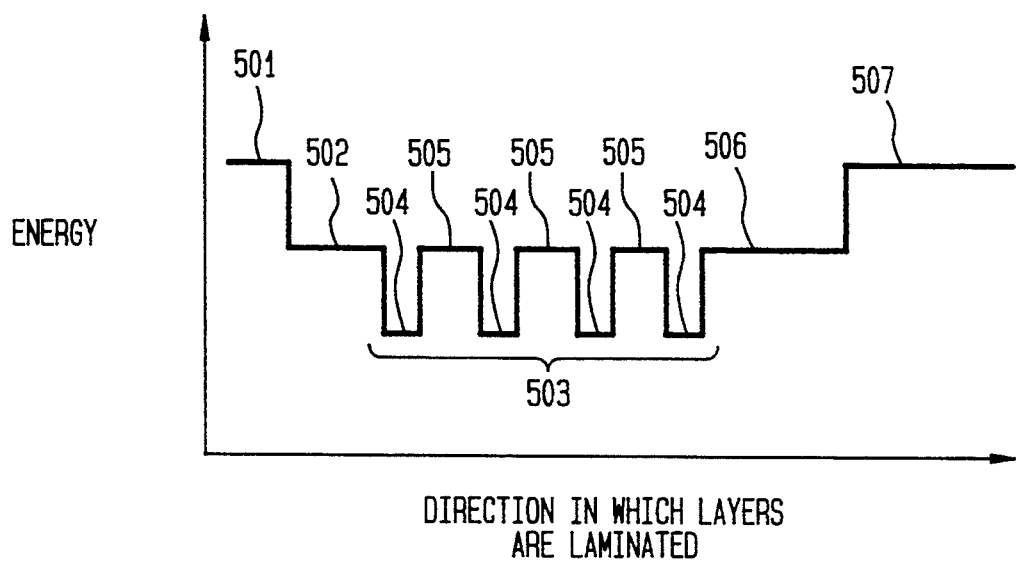
FIG. 5 is an energy band diagram of a conventional strained multiple quantum well active layer in which compressive strain is introduced to well layers.
Figure 6:
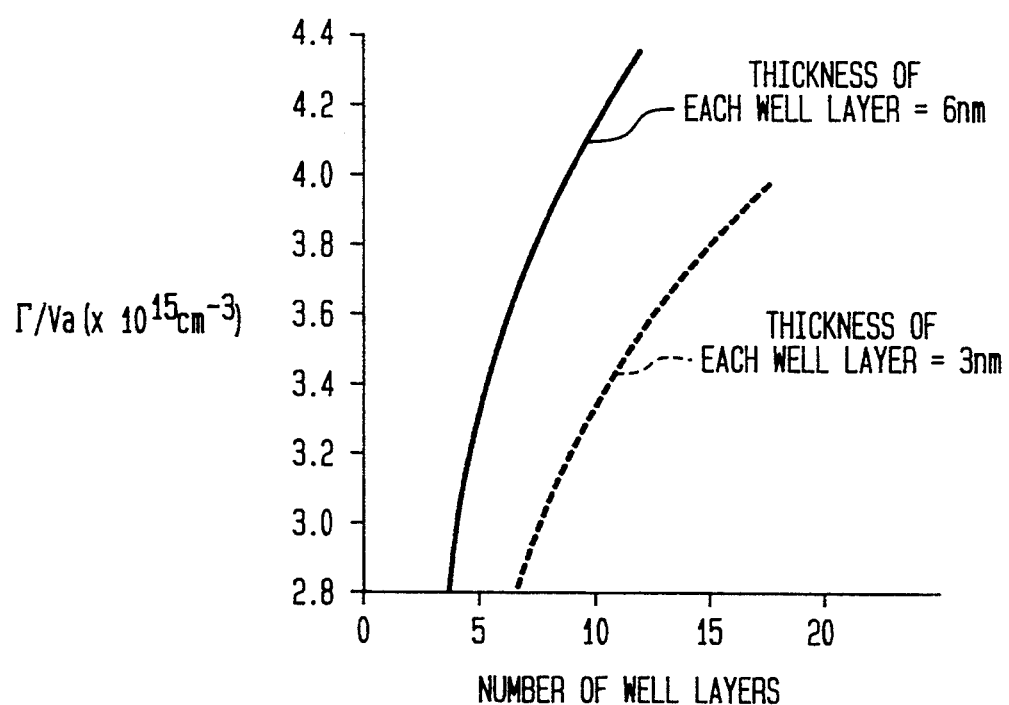
FIG. 6 is a graph illustrating the dependence of the optical confinement factor on the number of well layers of an exemplary strained multiple quantum well semiconductor laser, the optical confinement factor being normalized by a total volume of the well layers, with respect to a case where each layer has a thickness of 6 nm and a case where each layer has a thickness of 3 nm.
Figure 7B:
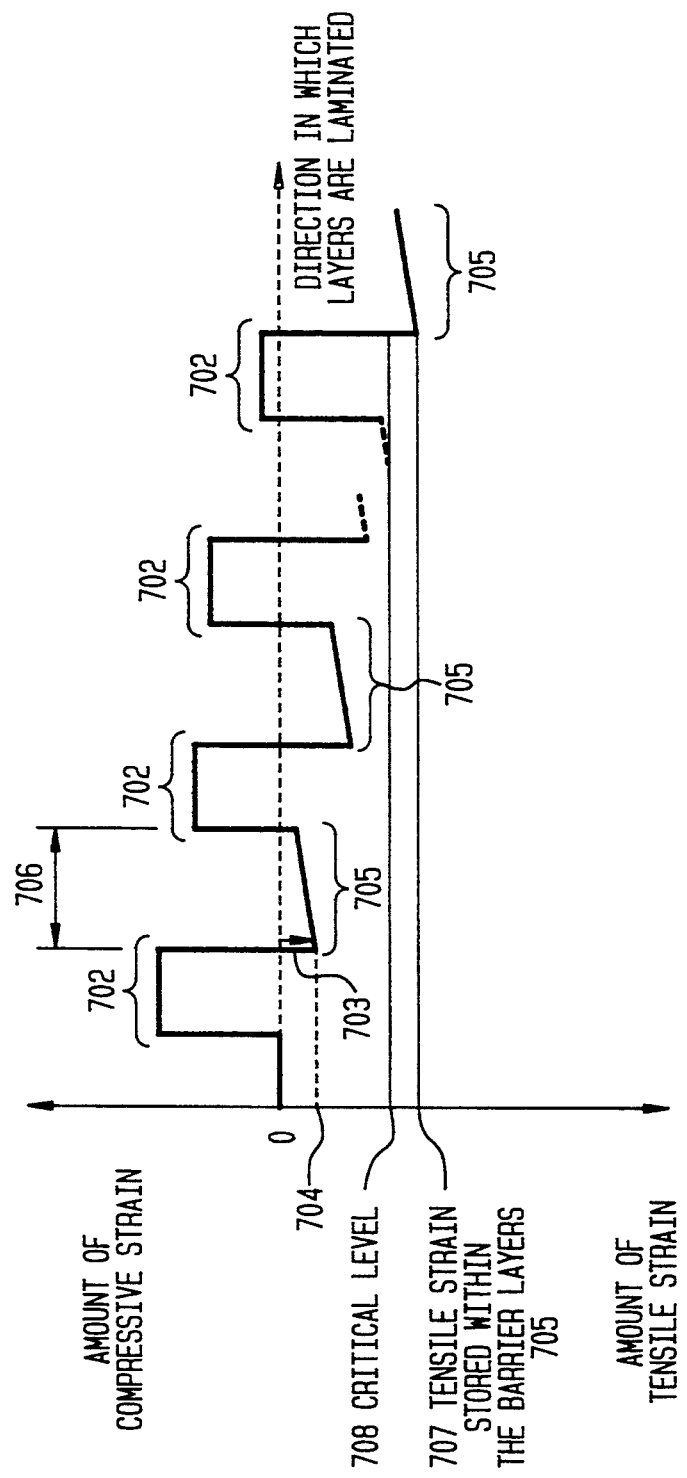

In the semiconductor laser shown in FIG. 3A, the undoped InGaAsP strain absorbing layer 316, which is a main feature of the present example, absorbs strain stored within the undoped $In_{0.86}Ga_{0.14}As_{0.31}P_{0.69}$ barrier layers 314. Therefore, as many as 14 undoped $In_{0.7}Ga_{0.3}As$ strained well layers 315 can be grown without making the thickness of each undoped $In_{0.86}Ga_{0.14}As_{0.31}P_{0.69}$ barrier layer 314 large. Moreover, the energy band gap of the undoped $In_{0.76}Ga_{0.24}As_{0.55}P_{0.45}$ strain absorbing layer 316 is smaller than that of each undoped $In_{0.86}Ga_{0.14}As_{0.31}P_{0.69}$ barrier layer 314, thereby preventing deterioration of the hole injection efficiency due to the undoped $In_{0.76}Ga_{0.24}As_{0.55}P_{0.45}$ strain absorbing layer 316. FIG. 4 illustrates the dependence of the relaxation frequency on the normalization current injected, with respect to the semiconductor laser of the present example and an exemplary strained multiple quantum well semiconductor laser. The exemplary strained multiple quantum well semiconductor laser has the same structure as that of the semiconductor laser of the present example except that the strain absorbing layer t hereof is made of undoped $In_{n.86}Ga_{0.14}As_{0.31}P_{0.69}$ by which light in a wavelength band of 1.1 $\mu$m can be obtained. As is seen from FIG. 4, the semiconductor laser of the present example has a relaxation frequency which is 1.2 times as high as that of the exemplary strained multiple quantum well semiconductor laser at any amount of normalization current injected. This indicates that deterioration of the hole injection efficiency due to the undoped $In_{0.76}Ga_{0.24}As_{0.55}P_{0.45}$ strain absorbing layer 316 is prevented because the energy band gap of the undoped $In_{0.76}Ga_{0.24}As_{0.55}P_{0.45}$ strain absorbing layer 316 is smaller than that of each undoped $In_{0.86}Ga_{0.14}As_{0.31}P_{0.69}$ barrier layer 314.

The present invention is applied to Fabry-Perrot-type semiconductor lasers in the above examples, but can also be applied to a distributed-feedback type semiconductor laser without losing the effect thereof. Moreover, the present invention can be applied to a semiconductor laser for emitting light in wavelength bands other than that of 1.55 μm. Although material systems of InGaAsP and InP are used in semiconductor lasers of the above examples, materials of other systems such as InGaAs along with GaAs, and AlGaInP along with GaAs can be used without undermining the effect of the present invention. Moreover, although built-in structure are described in the above examples, a ridge-type structure or other structures can alternatively be employed. Furthermore, although the examples described herein have only one strain absorbing layer, the invention also covers lasers having two or more strain absorbing layers.

As has been described, according to the present invention, it is made possible to produce a strained multiple quantum well structure including 10 or more strained well layers without letting dislocations occur within the active layer. Moreover, a semiconductor laser according to the present invention has a relaxation frequency 1.5 times as high as that of a conventional semiconductor laser at a given normalization current injected, because the hole injection efficiency thereof does not deteriorate. As a result, a semiconductor laser having a high operation speed can easily be obtained. Therefore, the present invention has a great significance in its practicality.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A strained multiple quantum well semiconductor laser comprising:
    a semiconductor substrate;
    a multiple quantum well active layer including a plurality of quantum well layers and a plurality of barrier layers, each of the plurality of quantum well layers having a lattice constant different from a lattice constant of the semiconductor substrate, and each of the plurality of barrier layers being interposed between two of the quantum well layers; and
    a multilayer structure including the multiple quantum well active layer, the multilayer structure being formed upon the semiconductor substrate,
    wherein at least one of the plurality of barrier layers is thicker than the other barrier layers, thereby serving as a layer for absorbing strain which is stored in the barrier layers due to a difference between the lattice constant of the semiconductor substrate and the lattice constant of each quantum well layer.

2. A strained multiple quantum well semiconductor laser according to claim 1, wherein the at least one of the barrier layers has such a thickness that a maximum value of the strain within each barrier layer is smaller than a critical level.

3. A strained multiple quantum well semiconductor laser according to claim 2, wherein the at least one of the barrier layers has a thickness twice as large as the thickness of each of the other barrier layers.

4. A strained multiple quantum well semiconductor laser according to claim 3, wherein the at least one of the barrier layers has a portion where substantially no strain is stored.

5. A strained multiple quantum well semiconductor laser according to claim 3, wherein the at least one of the barrier layers has such a thickness that light emitted by the multiple quantum well active layer is not into a plurality of portions.

6. A strained multiple quantum well semiconductor laser according to claim 1, wherein the at least one of the barrier layers which are thicker than the other barrier layers has an energy band gap substantially as large as an energy band gap of each of the other barrier layers.

7. A strained multiple quantum well semiconductor laser according to claim 1, wherein the at least one of the barrier layers which are thicker than the other barrier layers has an energy band gap smaller than an energy band gap of each of the other barrier layers.

8. A strained multiple quantum well semiconductor laser according to claim 1, wherein the semiconductor substrate includes a stripe-shaped ridge on a principal plane thereof, and the multilayer structure is formed on the stripe-shaped ridge.

9. A strained multiple quantum well semiconductor laser according to claim 1, wherein the multilayer structure includes a pair of cladding layers, the strained multiple quantum well active layer being interposed therebetween 10. A method for producing a strained multiple quantum well semiconductor laser comprising:
    a semiconductor substrate;
    a multiple quantum well active layer including a plurality of quantum well layers and a plurality of barrier layers, each of the plurality of quantum well layers having a lattice constant different from lattice constant of the semiconductor substrate, and each of the plurality of barrier layers being interposed between two of the quantum well layers; and
    a multilayer structure including the multiple quantum well active layer, the multilayer being formed upon the semiconductor substrate,
    wherein, when the plurality of quantum well layers and the plurality of barrier layers are alternatively formed so as to be laminated upon one another, at least one of the plurality of barrier layers is formed so as to be thicker than the other barrier layers.

11. A method for producing a strained multiple quantum well semiconductor laser according to claim 10, wherein the at least one of the barrier layers is formed with such a thickness that a maximum value of the each barrier layer is smaller than a critical level.

12. A method for producing a strained multiple quantum well semiconductor laser according to claim 11, wherein the at least one of the barrier layers is formed with a thickness twice as large as the thickness of each of the other barrier layers.

13. A method for producing e strained multiple quantum well semiconductor laser according to claim 12, wherein the at least one of the barrier layers is formed with a portion where substantially no strain is stored.

14. A method for producing a strained multiple quantum well semiconductor laser according to claim 13, wherein the at least one of the barrier layers is formed with such a thickness that light emitted by the multiple quantum well active layer is not split into a plurality of portions.

15. A method for producing a strained multiple quantum well semiconductor laser according to claim 10, wherein the at least one of the barrier layers which are thicker than the other barrier layers is made of a material having an energy band gap substantially as large as an energy band gap of a material of which each of the other barrier layers is made.

16. A method for producing a strained multiple quantum well semiconductor laser according to claim 10, wherein the at least one of the barrier layers is made of a material having an energy band smaller than an energy bend gap of a material of which each of the other barrier layers is made.

* * * * *

UNITED STATES PATENT AND TRADEMARK OFFICE
CERTIFICATE OF CORRECTION

PATENT NO. : 5,339,325
DATED : August 16, 1994
INVENTOR(S) : Masahiro Kito et al.

It is certified that error appears in the above-identified patent and that said Letters Patent is hereby corrected as shown below:

COVER PAGE [56] Other Publications, under "Resonance Frequency," "M. D. Tatham et al." should read --M. C. Tatham et al.--.

3) COVER PAGE [57] Abstract, line 3, after "quantum" insert --of--.

COVER PAGE [57] Abstract, line 11, after "layer" insert --for--.

COVER PAGE [57] Abstract, line 13, after "of" insert --the--.

COVER PAGE [57] Abstract, line 14, after "constant" insert --of--.

column 12, line 8, after "not" insert --split--.

column 12, line 30, after "between" insert --.--.

column 12, line 37, after "from" insert --a--.

UNITED STATES PATENT AND TRADEMARK OFFICE
CERTIFICATE OF CORRECTION

PATENT NO. : 5,339,325
DATED : August 16, 1994
INVENTOR(S) : Masahiro Kito et al.

It is certified that error appears in the above-identified patent and that said Letters Patent is hereby corrected as shown below:

column 12, line 42, after "multilayer" insert --structure--.

column 12, line 59, after "producing" the word "e" should be --a--.

column 14, line 3, after "band" insert --gap--.

column 14, line 4, "bend" should be --band--.

Signed and Sealed this

Seventh Day of March, 1995

Attest:

BRUCE LEHMAN

*Attesting Officer*          *Commissioner of Patents and Trademarks*